United States Patent [19]
Kerstein

[11] Patent Number: 6,157,623
[45] Date of Patent: Dec. 5, 2000

[54] APPARATUS AND METHOD FOR SELECTIVELY OUTPUTTING DATA USING A MAC LAYER INTERFACE OR A PCI BUS INTERFACE

[75] Inventor: Denise Kerstein, Mountain View, Calif.

[73] Assignee: Advanced Micro Devices, Inc., Sunnyvale, Calif.

[21] Appl. No.: 08/992,424

[22] Filed: Dec. 18, 1997

Related U.S. Application Data

[60] Provisional application No. 60/038,025, Feb. 14, 1997.

[51] Int. Cl.[7] .............................. H04B 7/14; H04L 12/50; H04L 12/28
[52] U.S. Cl. .......................... 370/315; 370/359; 370/419
[58] Field of Search .................................... 370/231, 232, 370/233, 234, 235, 236, 229, 230, 413, 359, 364, 419, 315

[56] References Cited

U.S. PATENT DOCUMENTS

| | | | |
|---|---|---|---|
| 5,485,576 | 1/1996 | Fee et al. . | |
| 5,515,376 | 5/1996 | Murthy et al. . | |
| 5,546,385 | 8/1996 | Caspi et al. . | |
| 5,852,723 | 12/1998 | Kalkunte et al. | 709/235 |
| 5,859,980 | 1/1999 | Kalkunte | 395/200.61 |
| 5,909,564 | 6/1999 | Alexander et al. | 710/131 |
| 5,933,413 | 8/1999 | Merchant et al. | 370/234 |
| 5,938,728 | 8/1999 | Dwork et al. | 709/222 |
| 6,009,104 | 12/1999 | Kalkunte | 370/448 |

FOREIGN PATENT DOCUMENTS 0 495 575 A1  7/1992  European Pat. Off. .

OTHER PUBLICATIONS

"Ethernet transceiver offers upgrade from existing networks", Greg Somer, Electronic Engineering, vol. 67, No. 820, Apr. 1995, pp. 25, 26, 28 and 30.

*Primary Examiner*—Chi H. Pham
*Assistant Examiner*—Brenda H. Pham

[57] ABSTRACT

Management data is selectively supplied to a management agent by a network switch using either a media access control (MAC) layer interface or PCI bus interface to provide maximum flexibility for the management agent. The management data includes management packets having at least a portion of a received data packet, and management information specifying receive status and network switch response characteristics to the corresponding received data packet. The network switch includes a plurality of network ports, including network traffic ports and one management queue for selectively supplying the management data to either the PCI interface or the management MAC interface. The selective output of the management frame via the alternate output paths enables the disclosed network switch to be implemented in existing switch fabric that uses a predetermined management protocol. The paths may also be segregated to optimize bandwidth for high priority data and low priority data, respectively.

25 Claims, 9 Drawing Sheets

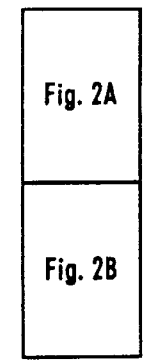
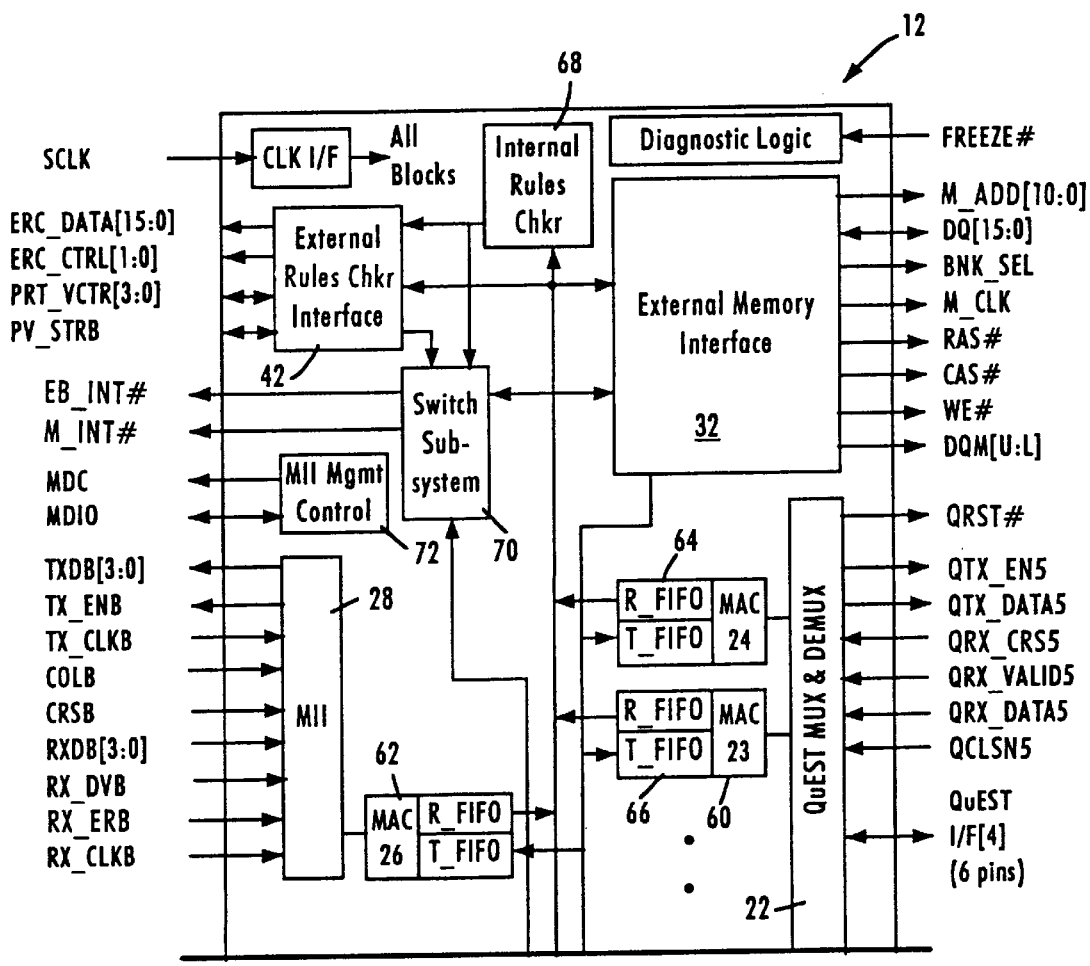
Fig. 2A

220

| Bit(s) | Name |
|---|---|
| 31-3 | RES |
| 2 | TRUNC |
| 1-0 | MANAGNT |

230

| Bit(s) | Name |
|---|---|
| 31 | VALRD |
| 30-29 | RES |
| 28-24 | VLANINDX |
| 23-16 | OPCD |
| 15 | UNI |
| 14 | RES |
| 13-0 | MANPTFP |

230a — 31 VALRD
230b — 28-24 VLANINDX
230c — 23-16 OPCD
230d — 15 UNI
230e — 13-0 MANPTFP

240

| Bit(s) | Name |
|---|---|
| 31 | VALRD |
| 30-29 | RES |
| 28-24 | VLANINDX |
| 23-16 | OPCD |
| 15 | UNI |
| 14 | RES |
| 13-0 | EXPBPFP |

| Bit(s) | Name |
|---|---|
| 31 | VALRD |
| 30-24 | RES |
| 23-16 | BINNUM |
| 15-9 | RES |
| 8-0 | ENTNUM |

230f — 31 VALRD
230g — 23-16 BINNUM
230h — 8-0 ENTNUM

Fig. 6

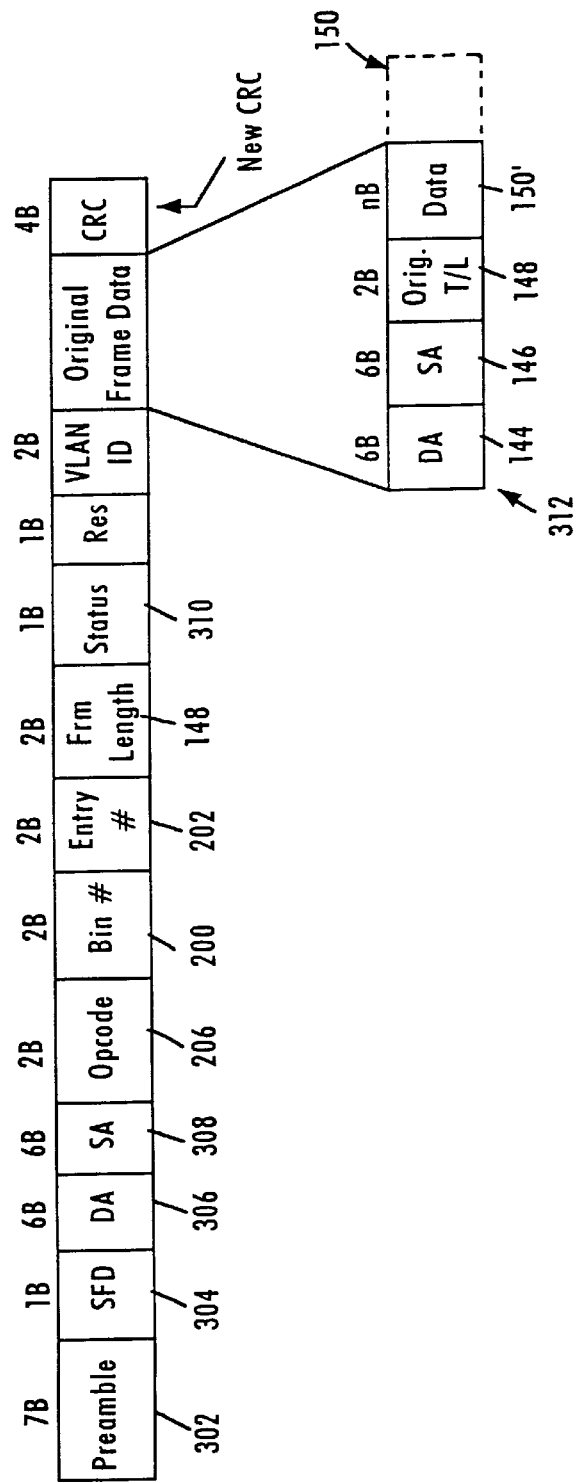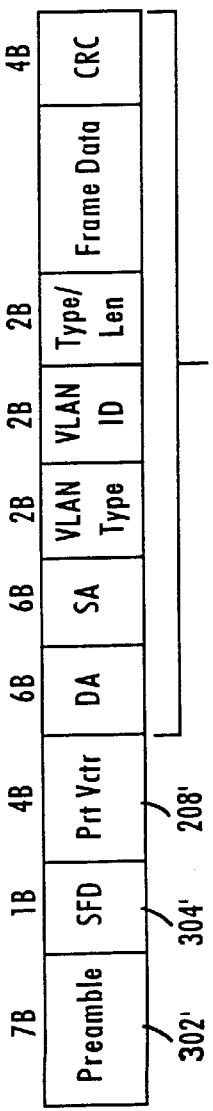
Fig. 7A
Fig. 7B

APPARATUS AND METHOD FOR SELECTIVELY OUTPUTTING DATA USING A MAC LAYER INTERFACE OR A PCI BUS INTERFACE

RELATED APPLICATIONS

This application claims priority from provisional patent application Ser. No. 60/038,025, filed Feb. 14, 1997, entitled INTEGRATED MULTIPORT SWITCH, which is incorporated herein by reference.

TECHNICAL FIELD

The present invention relates to network switching and more particularly, to a method and apparatus for providing network traffic data and management data between a network switch and a host computer controlling the network switch.

BACKGROUND ART

Switched local area networks use a network switch for supplying data frames between network stations, where each network station is connected to the network switch by a media. The switched local area network architecture uses a media access control (MAC) enabling a network interface card to access the media. The network switch passes data frames received from a transmitting station to a destination station based on the header information in the received data frame.

Networks typically will include a management agent that monitors activity by a hub or repeater. The management agent may include analysis and/or diagnostic equipment and may be concerned with statistical information related to the network in order to identify how well a network is being utilized. Such statistical information may include what types of packets are on the network, what protocols are being used on the network, the packet sender identity, the packet receiver identity, and the distribution of the packet lengths being transferred on the network.

Network repeaters will typically send management information to the management agent on a MAC layer protocol. For example, commonly-assigned U.S. Pat. No. 5,592,486 discloses a repeater that compares a destination address of a received data packet with a destination address corresponding to a management unit address. The data packet is compressed if the stored address does not match the destination address following transmission of the received data packet where transmission of the data packet to the management unit is halted once the counted number of bytes matches a stored number of bytes. A valid frame check sequence (FCS) is then provided at the end of the compressed data packet.

Commonly-assigned U.S. Pat. No. 5,550,803 also provides a MAC-layer transmission of received data packets to a management unit, where the data portion of a received data packet is transferred by a repeater to a management unit. Statistical information is then appended to the data portion following transmission of the received data packet during an interpacket gap interval.

As the repeater is sending management frames to the management agent, the management agent may be attempting to send data for the host management agent is responsible for controlling and configuring the repeater. Hence, attempts to provide configuration information from the host to the repeater may result in a reduction of bandwidth due to the contention between the repeater and the host, each attempting to exchange management information and configuration information across the respective MACs.

SUMMARY OF THE INVENTION

There is a need for an arrangement where a host management entity can access a switch without a reduction in bandwidth due to management frames output from the network switch.

There is also a need for an arrangement where a network switch is readily compatible with a host management entity having a preexisting management code specifying a particular transmission path.

There is also a need for an arrangement where high priority data and low priority data for the host management agent can be segregated along different data paths to preserve bandwidth for the high priority data.

These and other needs are attained by the present invention, where a network switch has an output buffer configured for selectively outputting data for a host via either a MAC layer interface or a PCI bus interface.

According to one aspect of the present invention, a network switch includes a PCI bus interface configured for enabling access by a host to the network switch, a media access control (MAC) layer interface configured for sending and receiving data frames to and from the host, and a first output buffer configured for selectively outputting data for the host via one of the MAC layer interfaces and the PCI bus interface. The first output buffer can be configured by the host to output data such as management data or expansion bus data via either the MAC layer interface and PCI bus interface, ensuring backwards compatibility with the existing management code of the host management agent. In addition, the selective output of data by either the MAC layer interface or the PCI bus interface enables the host to specify one transmission path for high priority data and another transmission path for low priority data between the network switch and the host.

Another aspect of the present invention provides a system including a host processor having a host PCI bus interface and a host media access layer (MAC) interface, and a network switch configured for sending and receiving data packets to and from network stations. The network switch includes a PCI bus interface in communication with the host PCI bus interface and configured for enabling access by the host to the network switch, a media access control (MAC) layer interface sending and receiving data frames to and from the host MAC interface, and a first output buffer configured for selectively outputting data to the host via one of the MAC layer interface and the PCI bus interface. The use of two transmission paths between the host and the network switch enables the host to use the PCI bus interface for high priority data, for example for configuring the network switch or loading data packets into the network switch for transmission to network stations, while simultaneously receiving management data related to network activity from the network switch via the MAC interface. The system also enables the host processor to access a data packet stored by the network switch for subsequent transmission on an expansion bus by the host processor. Hence, the disclosed system enables the host processor to maintain a high-throughput data path with the network switch, and a second data path for the transmission and reception of lower-priority data, for example management data.

Another aspect of the present invention provides a method in a network switch including the steps of storing data to be output to a host controlling the network switch in a first output buffer, selecting one of a PCI interface and a media access control (MAC) layer interface as an output path for the data to be output, and outputting the data to the host via the selected output path. The method provides flexibility in the network switch for the host, since the host can send and receive data to and from the network switch via a selected transmission path, depending on the configuration of the host.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

Reference is made to the attached drawings, wherein elements having the same reference numeral designations represent like elements throughout and wherein:

FIGS. 2A and 2B show block diagrams of a multiport switch constructed in accordance with an embodiment of the present invention and used in the packet switched system of FIG. 1.

FIG. 6 is a diagram illustrating registers within the multiport switch of FIG. 2 accessible via the PCI bus interface.

FIGS. 7A and 7B are diagrams illustrating the structure of management frames output by the network switch management MAC and the host management MAC, respectively.

DETAILED DESCRIPTION OF ILLUSTRATED EMBODIMENTS

The present invention will be described with the example of a switch in a packet switched network, such as an Ethernet (IEEE 802.3) network. A description will first be given of the switch architecture, followed by the arrangement for selectively outputting data via either a MAC layer interface or a PCI bus interface according to the present invention. It will become apparent, however, that the present invention is also applicable to other packet switched systems, as described in detail below.

Switch Architecture

Figure 1:
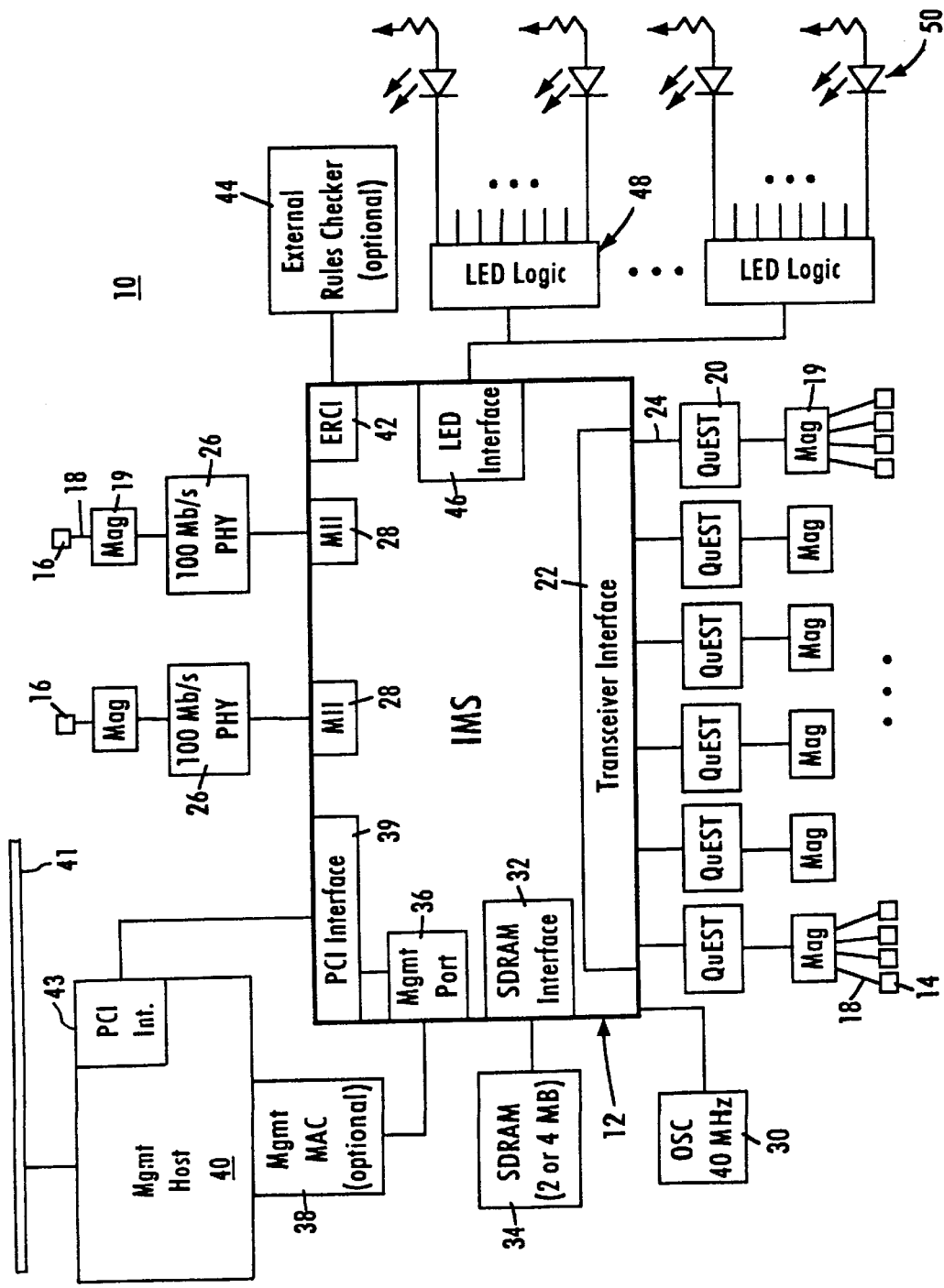
FIG. 1 is a block diagram of a packet switched system constructed in accordance with an embodiment of the present invention.

FIG. 1 is a block diagram of an exemplary system in which the present invention may be advantageously employed. The exemplary system 10 is a packet switched network, such as an Ethernet network. The packet switched network includes an integrated multiport switch (IMS) 12 that enables communication of data packets between network stations. The network may include network stations having different configurations, for example twenty-four (24) 10 megabit per second (Mb/s) network stations 14 that send and receive data at a network data rate of 10 Mb/s, and two 100 Mb/s network stations 16 that send and receive data packets at a network speed of 100 Mb/s. The multiport switch 12 selectively forwards data packets received from the network stations 14 or 16 to the appropriate destination based upon Ethernet protocol.

According to the disclosed embodiment, the 10 Mb/s network stations 14 send and receive data packets to and from the multiport switch 12 via a media 18 and according to half-duplex Ethernet protocol. The Ethernet protocol ISO/IEC 8802-3 (ANSI/IEEE Std. 802.3, 1993 Ed.) defines a half-duplex media access mechanism that permits all stations 14 to access the network channel with equality. Traffic in a half-duplex environment is not distinguished or prioritized over the medium 18. Rather, each station 14 includes an Ethernet interface card that uses carrier-sense multiple access with collision detection (CSMA/CD) to listen for traffic on the media. The absence of network traffic is detected by sensing a deassertion of a receive carrier on the media. Any station 14 having data to send will attempt to access the channel by waiting a predetermined time after the deassertion of a receive carrier on the media, known as the interpacket gap interval (IPG). If a plurality of stations 14 have data to send on the network, each of the stations will attempt to transmit in response to the sensed deassertion of the receive carrier on the media and after the IPG interval, resulting in a collision. Hence, the transmitting station will monitor the media to determine if there has been a collision due to another station sending data at the same time. If a collision is detected, both stations stop, wait a random amount of time, and retry transmission.

The 100 Mb/s network stations 16 preferably operate in full-duplex mode according to the proposed Ethernet standard IEEE 802.3x Full-Duplex with Flow Control—Working Draft (0.3). The full-duplex environment provides a two-way, point-to-point communication link between each 100 Mb/s network station 16 and the multiport switch 12, where the IMS and the respective stations 16 can simultaneously transmit and receive data packets without collisions. The 100 Mb/s network stations 16 each are coupled to network media 18 via 100 Mb/s physical (PHY) devices 26 of type 100 Base-TX, 100 Base-T4, or 100 Base-FX. The multiport switch 12 includes a media independent interface (MII) 28 that provides a connection to the physical devices 26. The 100 Mb/s network stations 16 may be implemented as servers or routers for connection to other networks. The 100 Mb/s network stations 16 may also operate in half-duplex mode, if desired. Similarly, the 10 Mb/s network stations 14 may be modified to operate according to full-duplex protocol with flow control.

As shown in FIG. 1, the network 10 includes a series of switch transceivers 20 that perform time division multiplexing and time division demultiplexing for data packets transmitted between the multiport switch 12 and the 10 Mb/s stations 14. A magnetic transformer module 19 maintains the signal waveform shapes on the media 18. The multiport switch 12 includes a transceiver interface 22 that transmits and receives data packets to and from each switch transceiver 20 using a time-division multiplexed protocol across a single serial non-return to zero (NRZ) interface 24. The switch transceiver 20 receives packets from the serial NRZ interface 24, demultiplexes the received packets, and outputs the packets to the appropriate end station 14 via the network media 18. According to the disclosed embodiment, each switch transceiver 20 has four independent 10 Mb/s twisted-pair ports and uses 4:1 multiplexing across the serial NRZ interface enabling a four-fold reduction in the number of PINs required by the multiport switch 12.

The multiport switch 12 contains a decision making engine, switching engine, buffer memory interface, configuration/control/status registers, management counters, and MAC (media access control) protocol interface to support the routing of data packets between the Ethernet ports serving the network stations 14 and 16. The multiport switch 12 also includes enhanced functionality to make intelligent switching decisions, and to provide statistical network information in the form of management information base (MIB) objects to an external management entity, described below. The multiport switch 12 also includes interfaces to enable external storage of packet data and switching logic in order to minimize the chip size of the multiport switch 12. For example, the multiport switch 12 includes a synchronous dynamic RAM (SDRAM) interface 32 that provides access to an external memory 34 for storage of received frame data, memory structures, and MIB counter information. The memory 34 may be an 80, 100 or 120 MHz synchronous DRAM having a memory size of 2 or 4 Mb.

As shown in FIG. 1, the system 10 also includes a management host 40 having two data interfaces, namely a management MAC interface 38 and a host PCI interface 43, for sending and receiving data between the multiport switch 12. The multiport switch 12 includes a management port 36 that selectively sends and receives management data packets according to a MAC layer protocol to management MAC interface 38. The multiport switch 12 also includes a PCI interface 39 enabling access by the management agent 40. As described below, the management host 40 may perform PCI burst transfers across the PCI interfaces 39 and 43 in order to transfer data to and from an expansion bus 41.

The multiport switch 12 includes an internal decision making engine that selectively transmits data packets received from one source to at least one destination station. The internal decision making engine may be substituted with an external rules checker. The multiport switch 12 includes an external rules checker interface (ERCI) 42 that allows use of an external rules checker 44 to make frame forwarding decisions in place of the internal decision making engine. Hence, frame forwarding decisions can be made either by the internal switching engine or the external rules checker 44.

The multiport switch 12 also includes an LED interface 46 that clocks out the status of conditions per port and drives LED external logic 48. The LED external logic 48, in turn, drives LED display elements 50 that are human readable. An oscillator 48 provides a 40 MHz clock input for the system functions of the multiport switch 12.

Figure 2B:
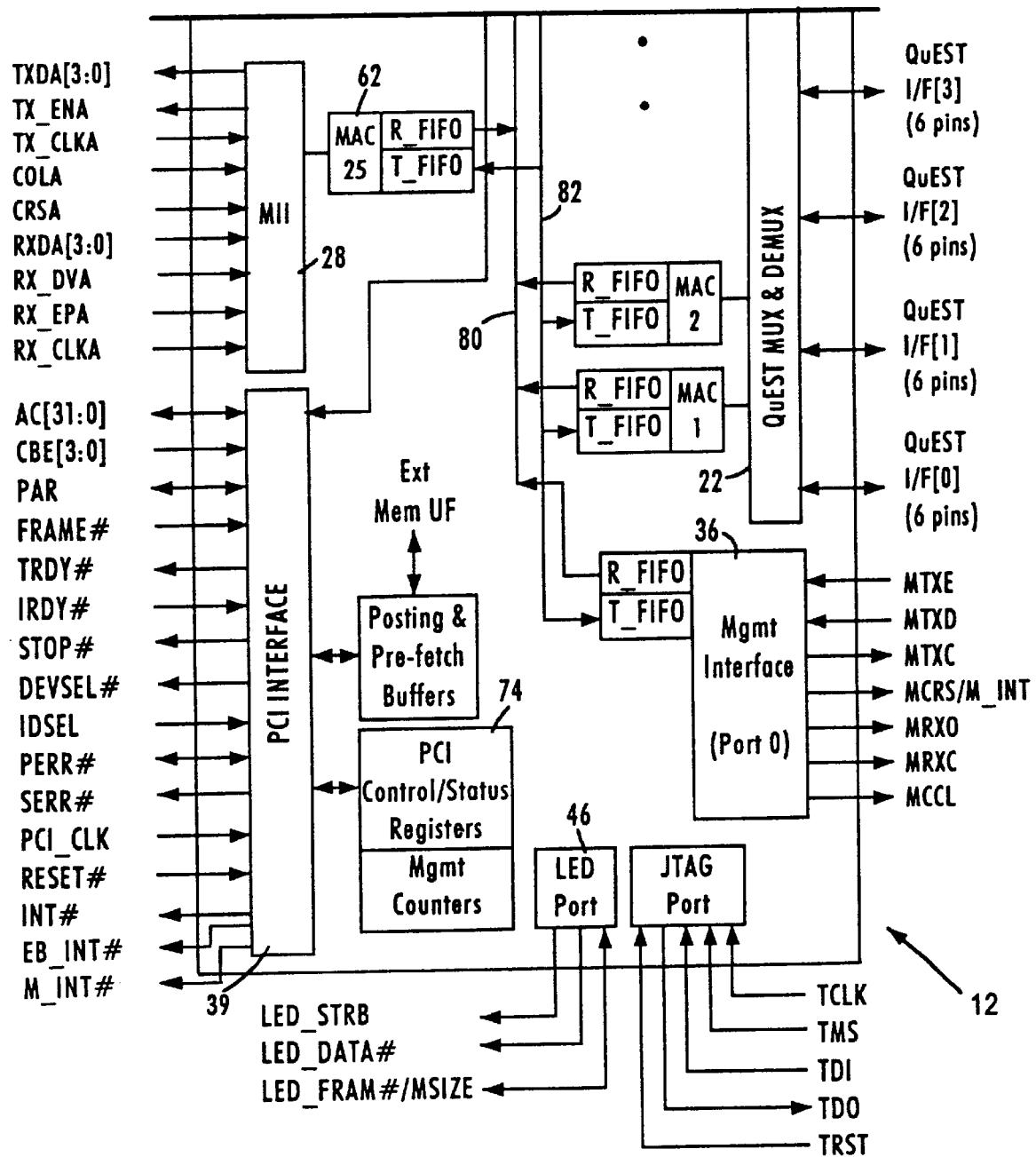

FIG. 2 is a block diagram of the multiport switch 12 of FIG. 1. The multiport switch 12 includes twenty-four (24) 10 Mb/s media access control (MAC) ports 60 for sending and receiving data packets in half-duplex between the respective 10 Mb/s network stations 14 (ports 1–24), and two 100 Mb/s MAC ports 62 for sending and receiving data packets in full-duplex between the respective 100 Mb/s network stations 16 (ports 25, 26). As described above, the management interface 36 also operates according to MAC layer protocol (port 0). Each of the MAC ports 60, 62 and 36 has a receive first in-first out (FIFO) buffer 64 and transmit FIFO 66. Data packets from a network station are received by the corresponding MAC port and stored in the corresponding receive FIFO 64. The received data packet is output from the corresponding receive FIFO 64 to the external memory interface 32 for storage in the external memory 34.

The header of the received packet is also forwarded to a decision making engine, comprising an internal rules checker 68 and an external rules checker interface 42, to determine which MAC ports will output the data packet. Specifically, the packet header is forwarded to an internal rules checker 68 or the external rules checker interface 42, depending on whether the multiport switch 12 is configured to operate using the internal rules checker 68 or the external rules checker 44. The internal rules checker 68 and external rules checker 44 provide the decision making logic for determining the destination MAC port for a given data packet. The decision making engine may thus output a given data packet to either a single port, multiple ports, or all ports (i.e., broadcast). For example, each data packet includes a header having source and destination address, where the decision making engine may identify the appropriate output MAC port based upon the destination address. Alternatively, the destination address may correspond to a virtual address that the appropriate decision making engine identifies as corresponding to a plurality of network stations. Alternatively, the received data packet may include a VLAN (virtual LAN) tagged flame according to IEEE 802.0d protocol that specifies another network (via a router at one of the 100 Mb/s stations 16) or a prescribed group of stations. Hence, either the internal rules checker 68 or the external rules checker 44 via the interface 42 will decide whether a frame temporarily stored in the buffer memory 34 should be output to a single MAC port or multiple MAC ports.

Use of the external rules checker 44 provides advantages such as increased capacity, a random-based ordering in the decision queue that enables frame forwarding decisions to be made before the frame is completely buffered to external memory, and enables decisions to be made in an order independent from the order in which the frames were received by the multiport switch 12.

The decision making engine (i.e., internal rules checker 68 or the external rules checker 44) outputs a forwarding decision to a switch subsystem 70 in the form of a port vector identifying each MAC port that should receive the data packet. The port vector from the appropriate rules checker includes the address location storing the data packet in the external memory 34, and the identification of the MAC ports to receive the data packet for transmission (e.g., MAC ports 0–26). The switch subsystem 70 fetches the data packet identified in the port vector from the external memory 34 via the external memory interface 32, and supplies the retrieved data packet to the appropriate transmit FIFO 66 of the identified ports.

Additional interfaces provide management and control information. For example, a management data interface 72 enables the multiport switch 12 to exchange control and status information with the switch transceivers 20 and the 100 Mb/s physical devices 26 according to the MII management specification (IEEE 802.3u). For example, the management data interface 72 outputs a management data clock (MDC) providing a timing reference on the bidirectional management data IO (MDIO) signal path.

The PCI interface 39 is a 32-bit PCI revision 2.1 compliant slave interface for access by the PCI host processor 40 to internal IMS status and configuration registers 74, and access external memory SDRAM 34. The PCI interface 39 can also serve as an expansion bus for multiple IMS devices. The management port 36 interfaces to an external MAC engine through a standard seven-wire inverted serial GPSI interface, enabling a host controller access to the multiport switch 12 via a standard MAC layer protocol.

Figure 3:
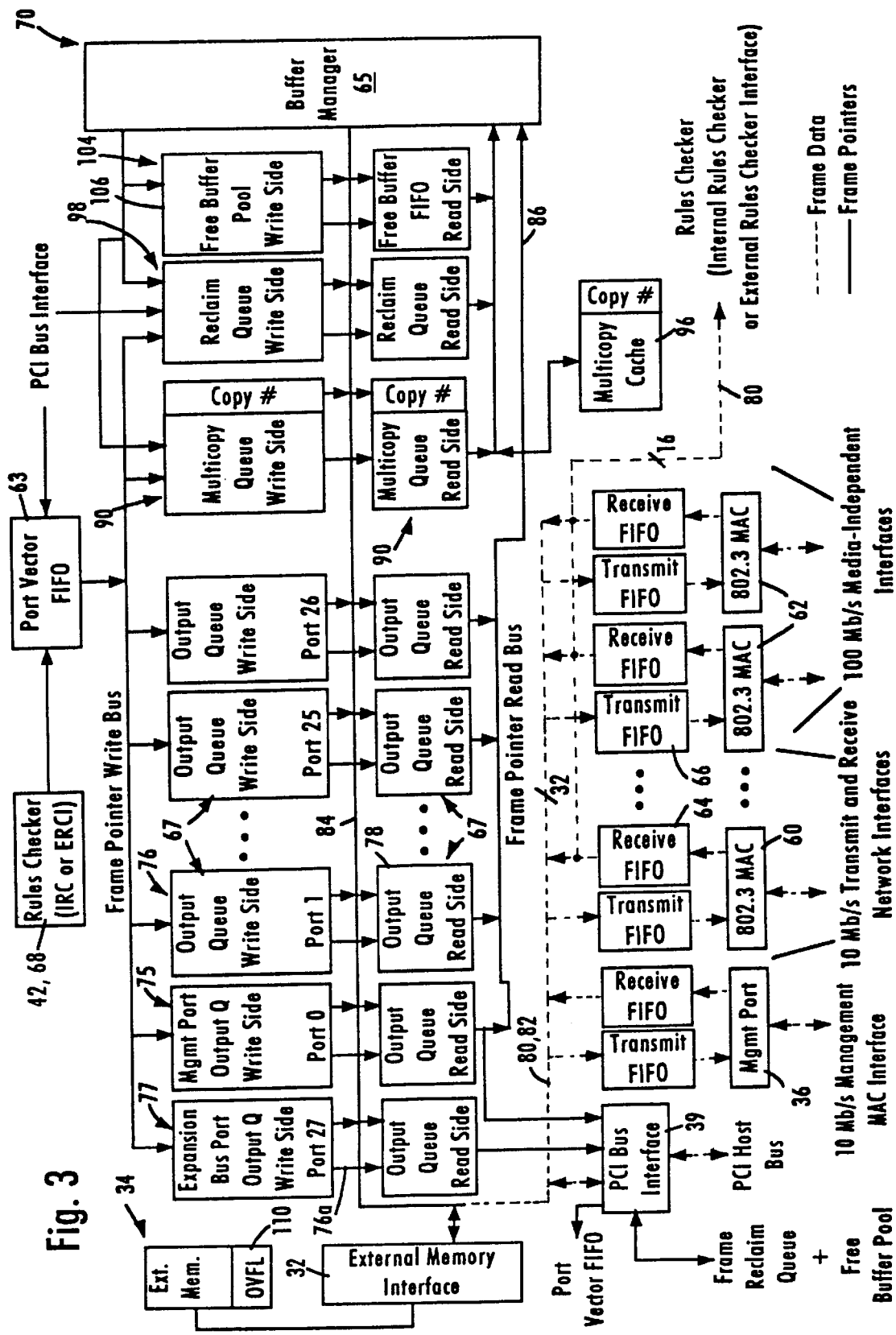
FIG. 3 is a schematic depiction of a switch subsystem of the multiport switch of FIG. 2, constructed in accordance with an embodiment of the present invention.

FIG. 3 depicts the switch subsystem 70 of FIG. 2 according to an exemplary embodiment of the present invention. Other elements of the multiport switch 12 of FIG. 2 are reproduced in FIG. 3 to illustrate the connections of the switch subsystem 70 to these other elements. The switch subsystem 70 contains the core switching engine for receiving and forwarding frames. The main functional blocks used to implement the switching engine include: a port vector FIFO 63, a buffer manager 65, a plurality of port output queues 67, a management port output queue 75, an expansion bus port output queue 77, a free buffer pool 104, a multicopy queue 90, a multicopy cache 96 and a reclaim queue 98. The operation and structure of these functional blocks will be described in more detail, but a brief overview of the switch subsystem 70 of FIG. 3 is first presented to provide context to the later discussion of the individual elements.

There are two basic types of frames that enter the multiport switch 12 from the ports: unicopy frames and multicopy frames. A unicopy frame is a frame that is received at a port which is to be transmitted by the multiport switch 12 to only one other port. By contrast, a multicopy frame is a frame that is received at one port for transmission to more than one port. In FIG. 3, each port is represented by a corresponding MAC 60, 62, or 36 having its own receive FIFO 64 and transmit FIFO 66.

Frames, whether unicopy or multicopy, are received by the internal MAC engines 60, 62, or 36, and placed in the corresponding receive FIFO 64. Each data frame has a header including at least a destination address, a source address, and type/length information. The header is provided to a rules checker (i.e., either the internal rules checker 68 or the external rules checker interface 42). The rules checker, based on the information in the header, determines from where the frame packet will be cast, i.e., through which port or ports will the frame packet be transmitted.

At the same time as the rules checker 42 or 68 is making its forwarding determination, the buffer manager 65 obtains a free frame pointer from the free buffer pool 104. The free frame pointer specifies a location in external memory 36 available for storing the data frame currently stored in the receive FIFO 64. The buffer manager 65 transfers the data frame from the receive FIFO 64 over a data bus 80 (see FIG. 2) to the external memory 34 in a direct memory access (DMA) transaction, and the data frame is stored in the location pointed to by the free frame pointer obtained from the free buffer pool 104.

The buffer manager 65 also sends the free frame pointer to the rules checker 42 or 68 to enable the appropriate rules checker to process the header information while maintaining the storage location of the data frame. This free buffer pointer is now referred to merely as a frame pointer, since it points to the memory location in the external memory 34 where the frame is stored. The rules checker 42 or 68 makes the forwarding decision, where the rules checker identifies at least one destination port for the data frame stored in the external memory 34 based on the corresponding header information, and generates a forwarding instruction in the form of a "port vector". In the exemplary illustrated embodiment, the port vector is a 28-bit vector with a bit set for each output port identified as a destination port to which the data frame should be forwarded. Assuming that the received frame is a unicopy frame, only one bit corresponding to the one destination port is set in the port vector generated by the rules checker 42 or 68. Hence, the rules checker uses the port vector to assign the frame pointer to at least one destination port.

The rules checker 42 or 68 places the port vector and the corresponding frame pointer (as well as a control opcode and a VLAN index) into the port vector FIFO 63. The port vector is examined by the port vector FIFO 63 to determine into which particular output queue 67 (or queues) the frame pointer associated with the port vector should be input. The port vector FIFO 63 assigns the frame pointer to the appropriate destination port(s) by placing the frame pointer into the top of the appropriate output queue 67, queuing the transmission of the data frame from the corresponding destination port. Hence, the frame pointer becomes an "assigned frame pointer," where it is assigned to a destination port.

At some point in time, the assigned frame pointer reaches the bottom of the output queue 67 after passing through the output queue 67. The buffer manager 65 takes the assigned frame pointer from the bottom of the output queue 67 using a frame pointer read bus 86, fetches the corresponding data frame in a DMA transaction from the location in external memory 36 pointed to by the assigned frame pointer, and places the fetched data frame into the appropriate transmit FIFO 66 via a data bus 82 (see FIG. 2) for transmission by the corresponding MAC layer.

A multicopy transmission is similar to the unicopy transmission, except that the port vector has multiple bits set, designating the multiple destination ports from which the frame will be transmitted. The frame pointer is assigned (i.e., stored in) each of the appropriate output queues 67 and transmitted from the corresponding transmit FIFOs 54.

The buffer manager 65 uses the special control queues, e.g., the free buffer pool 104, the multicopy queue 90, the reclaim queue 98, and the multicopy cache 96 to manage the process of allocating buffers to store received data frames, and retrieving buffers for re-use once the frame has been transmitted to its designated output port(s). The buffer manager 65 also maintains "overflow" regions in external memory 36 for the output queues 67, 75, 77 and the control queues 104, 90 and 98. Specifically, these queues each include a three-part configuration including on-chip and off-chip storage locations. On-chip storage is preferable for high performance, where all of the queuing structure is maintained on the chip (referring to the multiport switch 12). However, the real estate on a chip is very expensive and real estate costs create a problem when the chip is designed to switch, and needs to queue, a large number of entries. The present invention solves this dilemma by providing a single output queue that includes a high performance, low capacity section that is on-chip, and an overflow area that is off-chip, i.e., is implemented on a separate discrete memory chip 34. The overflow area thus allows the queue to serve as a large capacity queue as needed, and is configured within the output queue in a manner that the a relatively lower performance of the off-chip overflow area does not adversely affect the overall performance of the output queue.

Each logical queue 67, 75, 77, 90, 98, and 104 of the present invention includes a write-side queue 76 and a read-side queue 78 located on the chip 12, and an output queue overflow area (generally designated as 110) located in an assigned portion of the external memory 34. Access to the external memory 34 for all of the output queues 67 is through the external memory interface 32, as described earlier. The present invention takes advantage of the bursting nature of current external memories, so that the overflow data (e.g., frame pointers) is sent on and off the chip to the overflow queue area 110 in bursts over the bus 84 to the external memory 34.

The write-side queue 76 and the read-side queue 78 located on the chip 12 are considered to be small, expensive, and high-performance resources. By contrast, the overflow area 110, forming the third part of the output queue 67, provides a large, inexpensive, low-performance, large capacity path.

Each buffer 67, 75, 77, 90, 98, and 104 operates by the corresponding write-side queue 76 receiving the corresponding frame pointer entry at an input end of the write-side queue 76. The frame pointer points to the first buffer location in external memory storing the first 256 bytes of a data frame.

After the entry flows through and reaches the output end at the bottom of the write-side queue 76, control logic associated with the output queue 67 selects whether the entry should be output to the corresponding assigned portion 110 of the external memory 34 or the read-side queue 78. If there is available space in the read-side queue 78, and the overflow area 110 for that output queue 67 is empty, then one or more entries are passed directly from the write-side queue 76 to the read-side queue 78. This passing of the entry or entries directly from the write-side queue 76 to the read-side queue 78 is performed entirely on the chip 12, and thus provides a low-latency, fast flow-through of an entry.

If the read-side queue 78 is full, but there is not yet a burst-size amount of data in the write-side queue 76, then the entry remains in the write-side queue 76. If the read-side queue 78 is full and there is at least a burst-size amount of data (e.g., 16 bytes worth of entries) in the write-side queue 76, then the data is written in a burst fashion by the buffer manager 65 into the overflow area 110 in the corresponding assigned portion of the external memory 34. Eventually, the read-side queue 78 will empty, and if there is data in the overflow area 110, the buffer manager 65 will supply a burst of data from the overflow area 110 into the read-side queue 78 when the read-side queue 78 has enough space to accommodate the burst-size amount of data. Hence, the read-side queue 78 selectively receives the frame pointer from the write-side queue 76 or the assigned portion 110 of the external memory 34.

Hence if an output queue 67 begins to receive a large number of entries (e.g., frame pointers), these entries can be placed into the overflow area 110 to avoid overflowing the on-chip queue 78, minimizing possibility of discarding frames. The total amount of memory dedicated to the overflow areas 110 may also be readily changed by changing the size of the external memory 36. Furthermore, the sizes of the individual specific overflow areas 110 are programmable to customize the queue sizes, without impacting the performance of the output queues 74.

The multiport switch as depicted in FIGS. 1 and 2 has twenty-eight output queues serving the twenty-four 10 Mb/s user ports 60, the two 100 Mb/s server ports 62, the management port 36, and the expansion bus port 38, respectively. The output queues 67, 75 and 77 provide temporary storage for frame pointers when they are queued for transmission. Queuing takes the form of the port vector FIFO 70 writing frame pointers into the various output queues 67, 75 and 77 indicated in a forwarding port vector.

Figure 4:
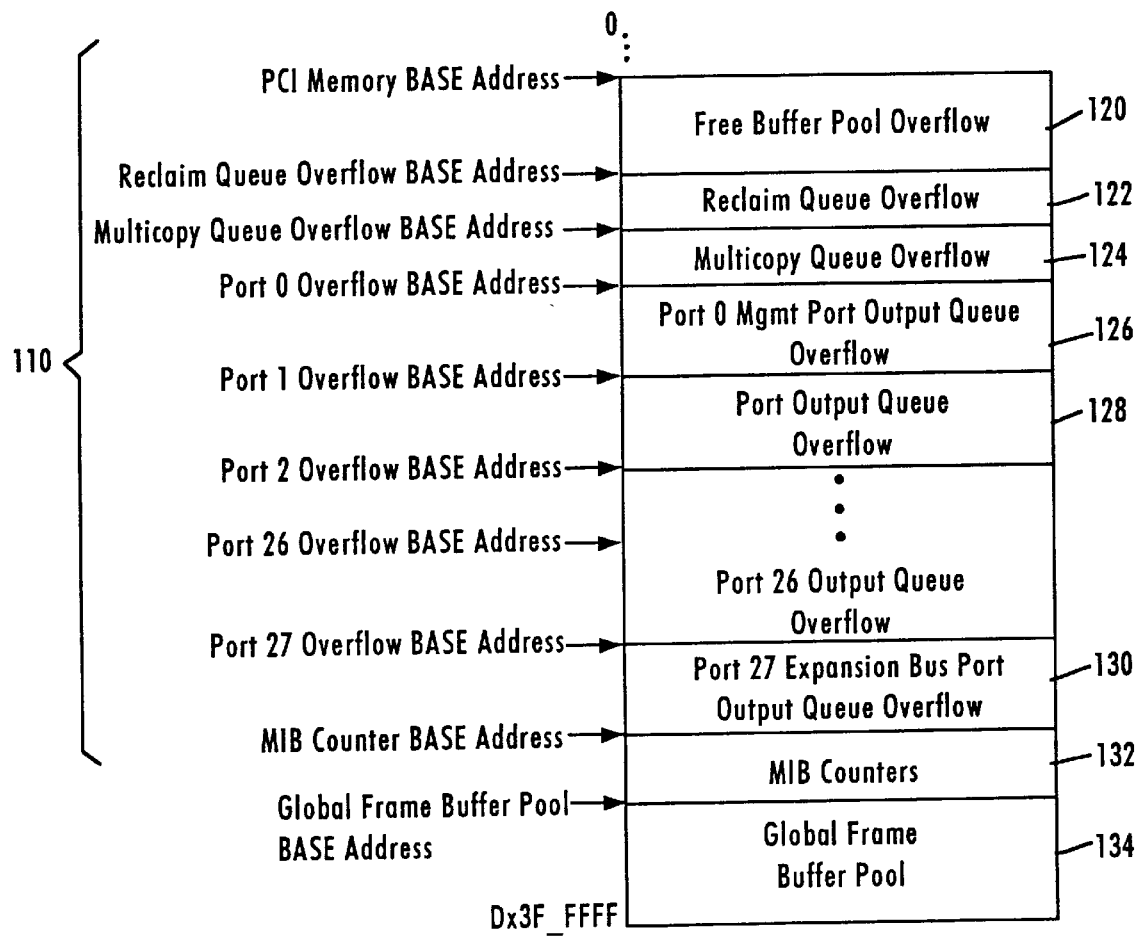
FIG. 4 is a memory map diagram of the external memory of FIG. 1, configured in accordance with an embodiment of the present invention.

FIG. 4 is a diagram illustrating an exemplary map of the external memory 34. The overall capacity of the external memory 34 may be, for example, 4 Mb, although other capacity memories are employed in different embodiments. The use of an external memory 34 for the overflow areas according to the present invention permits increasing or decreasing the size of the output queues by simply changing the external memory. This is an advantage over systems in which the queue structure is entirely on the chip, as the overall queuing capacity is set at manufacture of the chip.

To satisfy the overflow storage requirements of the switch 12, the overflow region 110 of the external memory 34 has assigned memory portions for a free buffer pool overflow 120, a reclaim queue overflow 122, a multicopy queue overflow 124, a management port output queue overflow 126, output queue overflows 128 for each of the 10 Mb/s and 100 Mb/s destination ports (Ports 0–26), and an expansion bus port (Port 27) output queue overflow 130. The memory 34 also includes assigned portions for the MIB counters 132, and the global frame buffer pool 134.

The BASE Address for the entire memory region is programmable in a memory base address register among the registers 74 on the chip. The BASE Address for each area in the external memory map is programmable in the register set. No length register is required, since the length for a given area is equal to the area from that area's BASE Address to the BASE Address of the next adjacent area in the mapping.

Since the length (and therefore capacity) of each of the individual overflow areas is programmable, the overall capacity of each queue is programmable. This feature of the present invention permits customization of the switch to provide particular output queues with increased capacity, as needed.

The overflow areas 110 store excess entries that do not fit into the control queues on the chip 12. For example, the free buffer pool overflow area 120 stores for the free buffer pool 104 the excess free frame pointers identifying the currently unused buffers in the global frame buffer pool 134. The reclaim queue overflow area 122 stores for the reclaim queue 98 excess frame pointers to linked-list chains that are no longer needed. The multicopy queue overflow area 124 stores for the multicopy queue 90 excess frame pointers with copy numbers ">=1" (for queued frame pointers) and frame pointers with copy numbers "−1" (for successfully transmitted frames). The management port output queue overflow area 126 stores for the management port queue 74 excess assigned frame pointers awaiting transmission to the management port 36 (Port 0). Output queue overflow areas 128 store excess assigned frame pointers awaiting transmission to the appropriate 10 Mb/s ports (Ports 1–24) or 100 Mb/s ports (Ports 25–26) for the respective port queues 67. The expansion bus port output queue overflow area 130 for the expansion bus port (Port 27) queue 77 stores frame pointers awaiting transmission to the expansion bus port.

The MIB counter region 132 contains all the per port statistics which are updated periodically by the switch 12. The switch 12 maintains 8-bit and 16-bit counters on-chip for storing MIB statistics. The switch 12 updates the 32-bit or 64-bit MIB counters in external memory 36 with the frequency required to prevent loss of MIB data.

The global frame buffer pool 134 contains buffers in linked-lists which store received frame data. At any given time, these linked lists contain valid frame data, obsolete buffers which will be returned by the buffer manager 72 to the free buffer pool 104, or locations owned by the PCI host processor (not shown).

Segregated Data Paths

The present invention will now be described with respect to selectively outputting data to the host processor 40 via one of the MAC layer interface 36 and the PCI bus interface 39.

The disclosed embodiment provides a particularly advantageous arrangement where management data to be supplied to the management agent 40 can be selectively output from the multiport switch 12 by either the PCI bus interface 39 or the management port 36. Outputting management data via the PCI bus interface 39 may be advantageous for a host processor 40 having preexisting management code configured for sending and receiving data solely via the PCI interface. As such, technical or practical limitations in the host processor 40 may render the option of sending management frames by the management port 36 impractical or undesirable. In such a case, the management host 40 can access the PCI control/status registers 74, shown in FIG. 2, to configure the management port output queue 75 of FIG. 3 to supply management information for output via the PCI bus interface 39.

Figure 8:
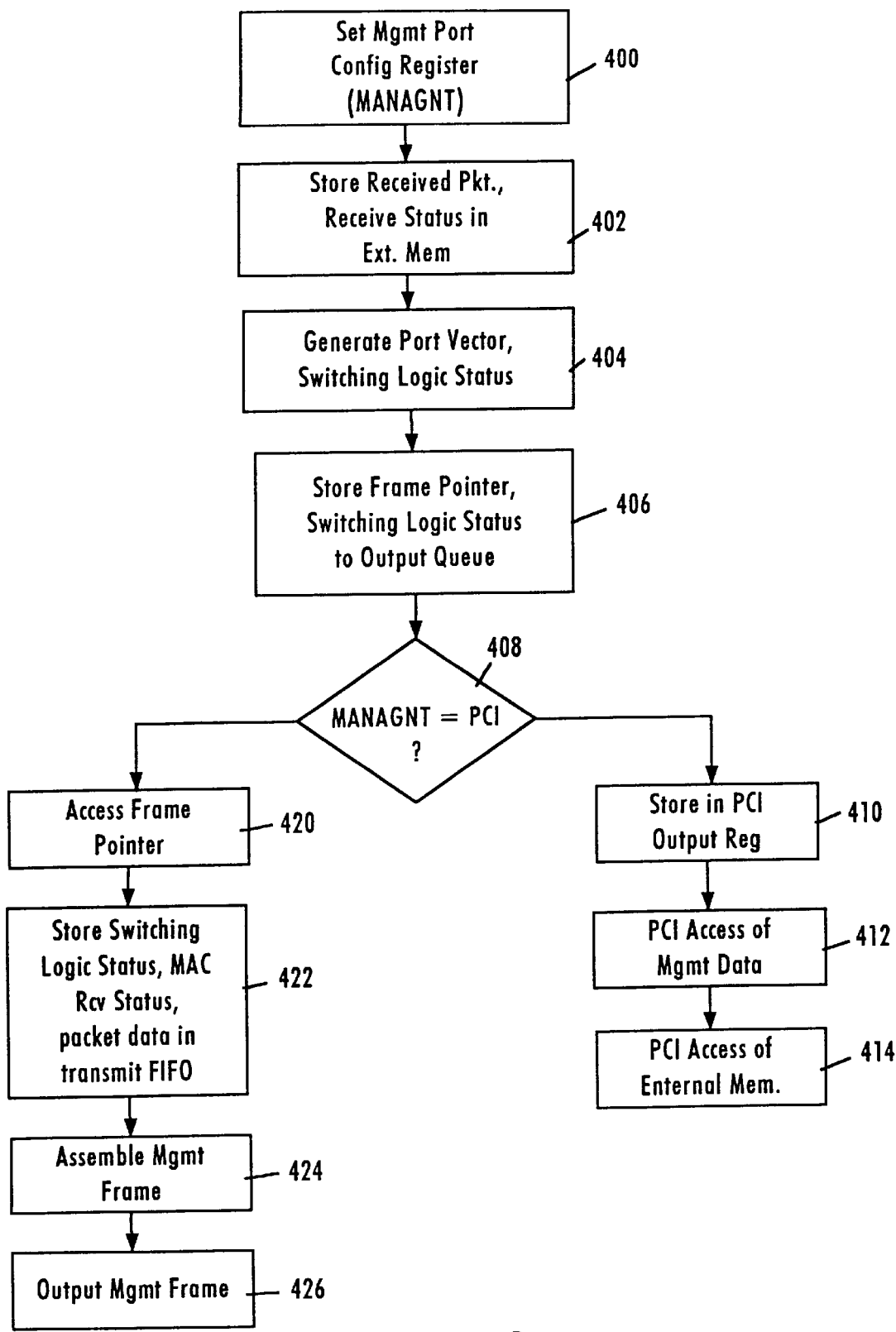
FIG. 8 is a diagram illustrating a method for selectively outputting data via one of the MAC layer interface and the PCI bus interface according to an embodiment of the present invention.

FIG. 8 is a diagram illustrating the overall method of selectively outputting data for the host processor 40 via one of the MAC layer interface 36 and the PCI bus interface 39 according to an embodiment of the present invention. As shown in FIG. 8, the management host 40 sets a management port configuration register in step 400 to output the data in the management port output queue 75 via either the PCI bus interface 39 or the management port 36. FIG. 6 is a diagram illustrating a portion of the PCI control/status registers 74, including a management port configuration register 220, a management port output queue register 230, and an expansion bus port output queue register 240. The host processor 40 accesses the management port configuration register 220 in step 400 and sets the two lowest significant bits equal to "01" (MANAGNT=01) if the contents of the management port output queue 75 are to be output via the management port 36, serving as a general purpose serial interface (GPSI). However, if the management data form the management port output queue 75 is to be output via the PCI bus interface 39, the management host 40 sets the MANAGNT field in the management port configuration register 220 to have the bit pattern "10" (MANAGNT=10). If the management agent 40 programs the management port configuration register 200 for reception of management data via the MAC interface 36, the management host 40 will also set a truncation field (TRUNC=1) if the management MAC 36 needs to truncate any data frames sent to the management MAC that are longer than 128 bytes.

After the management host 40 sets the management port configuration register 220 in step 400 of FIG. 8, the multiport switch 12 begins to receive data packets from network stations 14, 16, or the management host 40, described below. Data packets received from the network stations 14 or 16 are stored in step 402 in the external memory 34 along with received status information generated by the corresponding MAC at the receive port. Specifically, the MAC layer interface 60 or 62 receiving a data packet checks the status of the received data packet, to determine if the data packet is valid, or whether certain errors are encountered, for example cyclic redundancy check (CRC) errors, frame alignment errors, or whether the receive buffer 64 overflows during reception of the data packet, at which point the received data may not contain the entire data packet. Thus, each MAC receiving a data packet sends the received data packet and the MAC receive status to a specified memory location in the external memory 34 under the control of the buffer manager 65, as described above with respect to FIG. 3.

Figure 5:
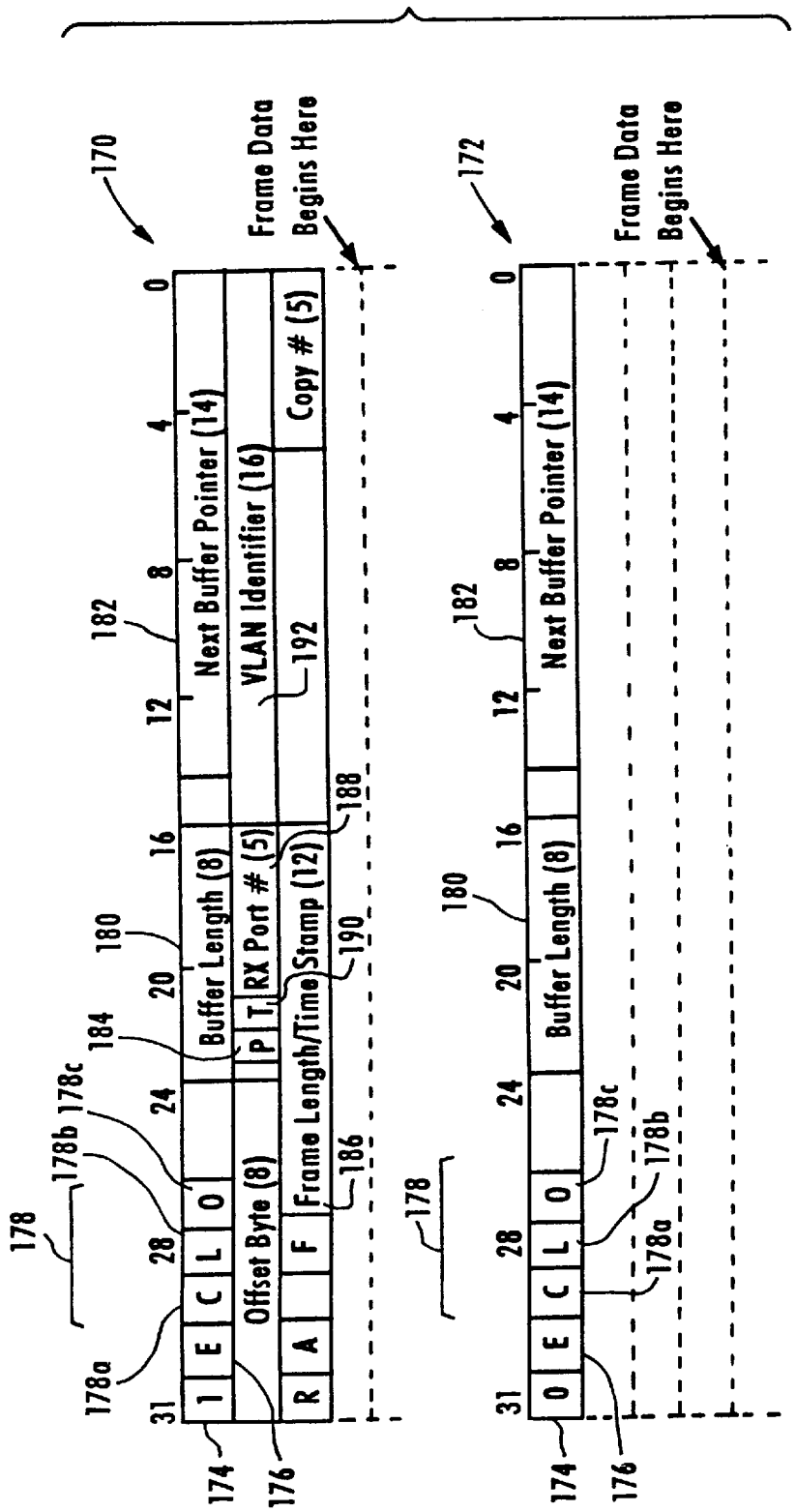
FIG. 5 is a block diagram illustrating a buffer structure within the external memory of FIG. 4.

FIG. 5 is a diagram illustrating the frame buffer header format for buffers in the external memory 34 storing the received data frame. The buffers are chained together by address pointers in each buffer header that indicate the next buffer's location in memory. The buffer headers also include the received status information transmitted by the corresponding MAC having received the data packet. Specifically, the first buffer header 170 and the subsequent buffer header 172 include a buffer format bit 174, an end of frame marker 176, receive status data 178, buffer length 180, and a next buffer pointer 182. The buffer format bit 174 specifies the format of the header as a first buffer header (having 12 bytes) or a subsequent buffer header (having 4 bytes), and is sued for chaining buffers. The end of frame marker 176 specifies that the corresponding buffer header is the last buffer for a frame when the bit is set to one, indicating there are no more buffers in the chain. The buffer length 180 specifies the total number of bytes which are valid in the data field of the buffer beginning with the first byte after the buffer header, and the next buffer pointer 182 includes the pointer to the next buffer. The next buffer pointer 182 will not be valid when the end of frame marker 176 is set.

The first buffer header 170 and the subsequent buffer header 172 includes receive status data 178. The C bit 178a indicates whether a CRC error was detected by the MAC. The L bit 178b indicates whether a frame alignment error was detected along with the CRC error in the receive frame by the MAC 60 or 62. The O bit 178c indicates whether the receive FIFO 64 overflowed, indicating that the data in the buffer may not be valid. The first buffer header 170 also includes a P bit 184 that specifies the port type of the incoming receive frame, where a zero indicates a 10 Mb/s port and a 1 indicates a 100 Mb/s port. The P bit 184 can be used by the host, in conjunction with the time stamp field 186, when the multiport switch 12 is programmed to forward frames to the expansion bus before the frame is completely received and buffered to external memory. The first buffer header 170 also includes a receive port number 188 specifying the port number from which the frame was received, and a T bit 190 that indicates whether the received frame type was tagged or untagged. The first buffer header 170 also includes the VLAN identifier 192 from the VLAN fields 154 and 156.

Hence, the MAC layer 60 or 62 determines the receive status of the received data packet, and forwards the information for storage in the buffer header 170 stored in the external memory 34. Storage of the received status data with respect to the condition of the received data frame (e.g., error-free, CRC error, frame alignment error) as well as the status of the receive port receiving the data packet (e.g., receive FIFO overflow, etc.) enables the multiport switch 12 to collect new information relevant to the reception of the received data packet for use by the management agent. This new information generated by the MAC layer 60 or 62 at the receive port is thus stored in the buffer header 170 as part of the new management information to be provided to the management entity, described in detail below.

As described above, the header of the received packet is forwarded to the rules checker 68 or 32 to determine which MAC ports will output the received data packet. The appropriate rules checker generates in step 404 the port vector and switching logic status data that specifies the decision logic for the received data packet. Specifically, the rules checker will generate switching logic data in the form of a port vector, and output the port vector to the port vector FIFO 63, shown in FIG. 3, for transmission of the received data packet to the select output ports, including the management port 36. The port vector includes a bin number and an entry number which form an index for use by the management agent in locating the rules checker address table entry. The port vector also includes the VLAN index specified by the rules checker, a control Opcode, a forwarding port vector, which identifies the destination ports, and the frame pointer which specifies the location in the external memory 34 storing the frame data and the corresponding header information as shown in FIG. 5.

The address index formed by the bin number and the entry number enables the management host 40 to access the specific rules checker address table entry generating the switching decision for the corresponding received frame. Specifically, the management agent is responsible for building and maintaining the address table for the rules checker 68 or the external rules checker 44 via the external rules checker interface 42. The management agent generates the initial list of all three entries in the address table, inserts addresses and their associated fields into the table, manages a software mapping of the address table in order to properly validate, add, delete, or age entries, and updates fields within address entries.

In addition, the rules checker is capable of learning about the presence of a new station 14 or 16 on the network. For example, a new station having a predetermined MAC address may send a data packet to another station via the multiport switch 12. If the rules checker does not include an address table entry for the source address identified in the source address field of the received data packet, the rules checker is capable of "learning" about the new station by updating its internal address tables to include a new address table entry for the new source address. Once the new address table entry has been formed, the rules checker can properly generate the forwarding port vector.

Table 1 lists exemplary codes within the control Opcode field that provide information for the management agent with respect to the identity of the received data packet and/or the status of the rules checker in response to reception of the data frame.

For example, assuming "MAC 23" in FIG. 2 was designated a sniffer port, then the management agent would be notified by a management interface 36 of every data packet transmitted and received by the "MAC 23." Similarly, the traffic capture 1 frame and traffic capture 2 frame codes enable the management agent to monitor traffic occurring between two ports or two MAC addresses in the event that more than one MAC address is -present on a given half-duplex network port.

The IRC address subfield includes characteristics of the internal rules checker 68 in response to reception of the data frame. For example, the IRC address field value 000 specifies that the source address has a corresponding address table entry in the rules checker. Conversely, the IRC field values "010" to "101" specify an unknown source address, along with whether or not the unknown source address was learned by the internal rules checker 68. In the event that unknown source address was not learned, different error conditions provide additional information for the management agent why the unknown source address was not learned, for example bad frame, no more room in the address table, or bin or free entry chain was locked (e.g., the memory structure storing the address table was locked). The specific error conditions may enable the management host to reconfigure the internal rules checker address table entries to recognize the unknown new station.

The port vector FIFO 63 receives the frame pointer, and the switching logic status including the control Opcode and VLAN index, and stores the frame pointer and the switching logic status to the management port output queue 75 based upon the corresponding port vector in step 406. Assuming that the port vector also specifies the expansion bus port output queue 77, the port vector FIFO 63 will store the frame pointer, control Opcode and VLAN index into the expansion bus port output queue 77.

The buffer manager 65 checks the management port configuration register 220 in step 408 to determine whether the management port output queue 75 is configured to output

TABLE 1

| Opcode Field | Field Name | Description |
| --- | --- | --- |
| 7-5 | Traffic Capture | 000=Null<br>001=Sniffer Port Frame<br>010=Traffic Capture 1 Frame<br>011=Traffic Capture 2 Frame<br>100–110=Reserved<br>111=Reserved (identifies additional opcode field) |
| 4-2 | IRC Address | 000=Known SA<br>001=Reserved (Known SA with High Priority)<br>010=Unknown SA learned (auto-validated or not validated)<br>011=Unknown SA not learned; Not learning or Bad Frame<br>100=Unknown SA not learned; Bin or Free Entry Chain was locked<br>101=Unknown SA not learned; no more room in Address Table<br>110=Unknown VLAN tag (VLAN Identifier not recognized)<br>111=Backbone Forwarding Mode SA Match Error |
| 1-0 | Mgmt Port/ Tagging | 00=Null<br>01=BPDU or Bridge Multicast Frame<br>10=Directed Frame (DA = an internal IMS port)<br>11=Disable "tag" on tagged port (for 100 Mb/s tagged ports) |

As shown in Table 1, the control Opcode includes three subfields, namely traffic capture, IRC address, and management port/tagging. The traffic capture field specifies if the received data packet is captured from monitored traffic. For example, the traffic capture field "001" specifies a sniffer port frame, where the "sniffer port" specifies that all traffic on the identified port is forwarded to the management agent.

to the PCI bus interface 39 (e.g., MANAGNT=PCI="10"). If the management port configuration register 220 indicates the data is to be output via the PCI bus interface 39, the buffer manager 65 stores in step 410 the management port output queue entry from management port output queue 75 to a management port output queue register 230 accessible by the management host 40 via the PCI bus interface 39. An interrupt signal (M_INT#) is then asserted indicating the presence of frame pointers in the management port output queue 75. The host 40 responds to the interrupt on the PCI bus interface 39 in step 412 by clearing the interrupt, and reading the management port output queue register 230 via a PCI access. During the PCI access in step 412, the management host 40 obtains a valid read bit (VALRD) 230a specifying whether a read to the register generated a valid or invalid read. The host 40 also reads a VLAN index field 230b, a control Opcode field 230c, a unicopy bit 230d, and a management port frame pointer 230e. The VLAN index field 230b (VLANINDX) is determined by the appropriate rules checker. The control Opcode field 230c (OPCD), described above, indicates why the management port is receiving the frame. For example, if the Opcode has a value (xxx110xx), the actual received VLAN ID was not recognized, indicating to the host processor 40 that the VLAN ID from the frames buffer header should be examined from the VLAN identifier field 192 of FIG. 5. The unicopy bit 230d indicates whether the data packet is a unicopy transmission to the management port or a multicopy transmission which includes the management port.

As described above, the Opcode field 230c may include information with respect to an unknown source address that is learned by the rules checker. Specifically, if the Opcode value equals "xxx010xx," indicating that an unknown source address was learned, the host 40 will perform a second read of the management port output queue register 230 to obtain the fields 230f, 230g, and 230h. The valid read field 230f (VALRD) specifies if the second read to the register generated a valid or invalid read. The bin number field 230g (BINNUM) and the entry number field 230h (ENTNUM) provide an index pointer for the management host 40 to identify an address location in the rules checker memory storing the switching logic information for the corresponding source address. Alternatively, if the Opcode field 230c specifies that the unknown source address was not learned, then the management host 40 will recognize that direct access of the rules checker memory is necessary to add the appropriate switching information.

After the management host 40 has accessed the management data in the management port frame pointer 230e, the management host 40 can then perform a PCI access in step 414 of the external memory to obtain the storage data packet and the corresponding header information 170 and 172 for additional management information.

As described above, the management port output queue 75 can be configured to output the data specified by the management port output queue entry to the management MAC interface 36 based on setting the MANAGNT field of the management port configuration register 220 to equal "01." Hence, if in step 408 the buffer manager determines that the management port configuration register is set to output data frames via the management port 36, the buffer manager 65 accesses the frame pointer from the output queue 75 in step 420. Specifically, the buffer manager 65 accesses the external memory 34 at the buffer memory location pointed to by the frame pointer, and fetches the header 170, the corresponding frame data, and subsequent buffers 172 as appropriate. The buffer manager stores the accessed switching logic status, MAC received status, and received packet information into the transmit FIFO 66 of the management MAC port 36 in step 422. The management MAC port 36 then assembles the management frame in step 424 to obtain the data frame shown in FIG. 7A.

The data frame 300 in FIG. 7A includes a preamble 302 and start frame delimiter (SFD) 304 according to Ethernet protocol. The management port MAC 36 then generates the destination address 306 as corresponding to the base address of the management port MAC 36. Setting the destination address 306 to equal the address of the management port 36 enables the management agent receiving the data packet via the management MAC 38 to identify the received data packet as a management frame. The source address 308 is set by the management port 36 to equal the address of the MAC 60 or 62 having received the data packet. For example, if the data packet was received by "MAC 23," shown in FIG. 2, then the source address 308 would be set to equal the address of the "MAC 23." The management port 36 then inserts the Opcode field 206 including the management information as described above with respect to Table 1. The management port 36 then adds the bin number 200 and entry number 202, followed by the frame length 148 of the original received frame. The bin number and entry number fields 200 and 202 need to be supplied only if the received data frame is a learned frame.

The management port MAC 36 then generates a status field 310 that includes the values of the received status bits CRC error bit 178a, frame alignment error bit 178b, receive FIFO overflow error 178c, and the tagged frame bit 190 specifying whether the original frame was tagged. The status field 310 also includes a compressed frame bit specifying whether the frame has only 128 bytes of the original frame. Specifically, the management port MAC 36 is configured to transmit up to 128 bytes of a received data frame 312 if a truncation feature is set within the management port 36. The original data frame 312 is configured to include the original destination address 134, the original source address 146, the original type-length 148, and the data field 150. If truncation is set within the management port 36, then a data field 150 having a length greater than 114 bytes will be truncated, so that only the truncated portion 150' will be transmitted. However, if the data field 150 is less than 114 bytes, then the entire data field will be transmitted.

After the management port 36 has generated the fields for the data packet 300, the management port 36 generates a new CRC field 314 that accurately reflects the number of bytes in the management frame 300. Once the CRC field 314 is generated by the management port 36, the management frame 300 is output by the management port 36 to the management MAC 38 shown in FIG. 1 for processing by the management agent.

Hence, the management agent is able to receive a management data frame that includes specific information about the type of data packet received by the multiport switch, the port 60 receiving the data packet, received status information corresponding to the received data frame itself as well as the received port receiving the data packet, and information generated by the switching logic specifying information related to traffic capture, IRC address learning, and management port tagging. The management frame also includes at least a portion of the received data frame. Hence, the management data frame provides specific detailed information related to the received data packet and the multiport switch's response to the reception of the data packet. Hence, the management agent can receive a plurality of management frames from the management port 36, independent from the order in which the data packets were received by the multiport switch 12. In addition, the information provided by the MAC layer and the rules checker enables the management agent to determine the appropriate course of action, including whether to respond to the monitored traffic, or whether to update the address tables associated with the switching logic of the rules checker 44 or 68.

The management MAC 36 then outputs the management frame 300 in step 426.

The management agent may also output a management data packet 400 to the management port 36, shown in FIG. 7B. As shown in FIG. 7B, the management data packet 400 includes a port vector 208' that specifies a group of the network ports to transmit the network packet, and a network data packet 142' to be transmitted by the specified network ports. Hence, the management data packet 400 enables the rules checker to be bypassed, where the port vector is directly supplied to the port vector FIFO 63 for processing. As will be readily apparent from above, the buffer manager will also assign a frame pointer to the network data packet 142', enabling transmission throughout the switch subsystem 70.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. A network switch comprising:
   a PCI bus interface configured for enabling access by a host to the network switch;
   a media access control (MAC) layer interface configured for sending and receiving data frames to and from the host; and
   a first output buffer configured for selectively outputting data for the host via one of the MAC layer interface and the PCI bus interface.

2. The switch of claim 1, further comprising a buffer configuration register accessible by the host for setting the first output buffer to output the data to one of the MAC layer interface and the PCI bus interface.

3. The switch of claim 1, further comprising a second output buffer for storing high priority data, the host accessing the high priority data via the PCI interface and selectively controlling output of management data from the first output buffer via one of the PCI bus interface and the MAC layer interface.

4. The switch of claim 3, further comprising an external memory interface configured for supplying and retrieving data to and from an external memory, the first output buffer storing management frame pointers and the second output buffer storing high priority frame pointers, the management frame pointers and the high priority frame pointers identifying external memory locations of the management data and high priority data, respectively.

5. The switch of claim 4, further comprising a buffer manager configured for retrieving at least a portion of the management data via the external memory interface based on a corresponding management frame pointer retrieved from the first output buffer, the MAC layer interface sending the at least a portion of the retrieved management data in one of said data frames to the host.

6. The switch of claim 4, wherein the second output buffer outputs the high priority frame pointers to the PCI bus interface in response to a PCI access of the second output buffer by the host.

7. The switch of claim 6, wherein the PCI bus interface is configured to enable a PCI access by the host to the external memory locations specified by the high priority frame pointers accessed by the host via the external memory interface.

8. The switch of claim 4, wherein the first output buffer stores for each of the management frame pointers a corresponding set of management status fields.

9. The switch of claim 8, wherein the management status fields include an operational code specifying characteristics of the corresponding management data, and a switching memory index pointer specifying a memory location of switching information for a received data frame corresponding to the management data.

10. The switch of claim 1, further comprising:
    an external memory interface configured for supplying and retrieving data to and from external memory locations based on respective frame pointers;
    a plurality of output buffers serving a plurality of said MAC layer interfaces, respectively; and
    a port vector manager, accessible by the host via the PCI bus interface, for supplying a specified frame pointer to a specified plurality of the output ports.

11. The switch of claim 10, wherein the port vector manager receives the specified frame pointer and a port vector from the host via the PCI bus interface, the port vector identifying the specified plurality of the output ports, the port vector manager supplying the specified frame pointer to the specified plurality of the output ports based on the received port vector.

12. A system comprising:
    a host processor having a host PCI bus interface and a host media access layer (MAC) interface;
    a network switch configured for sending and receiving data packets to and from network stations, the network switch comprising:
    (1) a PCI bus interface in communication with the host PCI bus interface and configured for enabling access by the host to the network switch;
    (2) a media access control (MAC) layer interface sending and receiving data frames to and from the host MAC interface; and
    (3) a first output buffer configured for selectively outputting data to the host via one of the MAC layer interface and the PCI bus interface.

13. The system of claim 12, wherein:
    the system further comprises an external memory configured for storing data in respective identified memory locations, the data including received data packets and receive data identifying reception characteristics of the received data packets, respectively;
    the network switch further comprises an external memory interface for accessing the external memory, the network switch configured for accessing selected data based on a frame pointer specifying the corresponding identified memory location.

14. The system of claim 13, wherein the host accesses selected data from the external memory based on retrieval of the corresponding frame pointer.

15. The system of claim 14, wherein the first output buffer stores management data fields for each corresponding frame pointer, the host retrieving the frame pointer and the corresponding management data from the first output buffer via the PCI interface.

16. The system of claim 13, wherein the first output buffer comprises a first buffer portion and a MAC transmit buffer portion, the first buffer portion storing said frame pointer and corresponding status fields, the MAC transmit buffer portion configured for storing, for each packet to be transmitted by the MAC layer interface, the corresponding management status fields, the corresponding receive data, and at least a portion of the corresponding received data packet.

17. The system of claim 16, wherein the network switch further comprises a second output buffer for storing second frame pointers specifying storage locations of expansion bus data in the external memory, the host accessing the second frame pointers from the second output buffer via the PCI interface and transferring the expansion bus data from the external memory to an expansion bus based on the corresponding retrieved second frame pointers.

18. The system of claim 16, wherein the management status fields for each corresponding received data packet include an operational code specifying corresponding characteristics, and a switching index pointer for identifying corresponding switching information.

19. The system of claim 16, wherein the host accesses the frame pointer and the corresponding status fields from the first buffer portion via the PCI interface.

20. The system of claim 13, wherein the network switch further comprises a second output buffer for storing second frame pointers specifying storage locations of expansion bus data in the external memory, the host accessing the second frame pointers from the second output buffer via the PCI interface and transferring the expansion bus data from the external memory to an expansion bus based on the corresponding retrieved second frame pointers.

21. A method in a network switch comprising:

storing data to be output to a host controlling the network switch in a first output buffer;

selecting one of a PCI interface and a media access control (MAC) layer interface as an output path for the data to be output; and outputting the data to the host via the selected output path, wherein the selecting step comprises setting the output path in response to the host setting a path configuration in the network switch.

22. A method in a network switch comprising:

storing data to be output to a host controlling the network switch in a first output buffer;

selecting one of a PCI interface and a media access control (MAC) layer interface as an output path for the data to be output; and outputting the data to the host via the selected output path, wherein:

the first output buffer includes a first buffer portion and a MAC transmit buffer portion; and the storing step comprises: (1) storing a frame pointer, specifying a storage location of a data packet to be output to the host, and management status fields corresponding to the data packet to be output, and (2) selectively storing the management status fields and at least a portion of the data packet in the MAC transmit buffer portion based on the corresponding frame pointer.

23. The method of claim 22, wherein the outputting step comprises:

(1) outputting the frame pointer and the management status fields from the first buffer portion to the host via the PCI interface if the PCI interface is the selected output path; and (2) outputting from the MAC transmit buffer portion the management status fields and the at least a portion of the data packet if the MAC layer interface is the selected output path.

24. The method of claim 22, further comprising storing in an external memory at the storage location specified by the frame pointer the data packet to be output to the host and corresponding receive data; and wherein the first output buffer storing step further comprises (3) accessing the frame pointer from the first buffer portion, and (4) transferring the management status fields, the at least a portion of the data packet, and the corresponding receive data in the MAC transmit buffer portion based on the accessed frame pointer.

25. The method of claim 22, further comprising storing in an external memory at the storage location specified by the frame pointer the data packet to be output to the host and corresponding receive data;

wherein the outputting step comprises enabling access of the storage location in the external memory by the host via the PCI interface.

* * * * *